(12) United States Patent
Basceri et al.

(10) Patent No.: US 7,037,730 B2
(45) Date of Patent: May 2, 2006

(54) CAPACITOR WITH HIGH DIELECTRIC CONSTANT MATERIALS AND METHOD OF MAKING

(75) Inventors: Cem Basceri, Boise, ID (US); Gurtej S. Sandhu, Boise, ID (US); Mark Visokay, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 882 days.

(21) Appl. No.: 09/904,112

(22) Filed: Jul. 11, 2001

(65) Prior Publication Data

US 2003/0011961 A1 Jan. 16, 2003

(51) Int. Cl.
*H01L 21/8242* (2006.01)

(52) U.S. Cl. .................... 438/3; 438/253; 438/240; 438/396

(58) Field of Classification Search .............. 438/3, 438/239–242, 250–256, 393–399
See application file for complete search history.

(56) References Cited

U.S. PATENT DOCUMENTS

| | | | |
|---|---|---|---|
| 5,555,486 A * | 9/1996 | Kingon et al. .............. 257/295 |
| 5,786,248 A | 7/1998 | Schuegraf | |
| 5,814,852 A | 9/1998 | Sandhu et al. | |
| 5,879,957 A * | 3/1999 | Joo ............................ 438/240 |
| 5,935,650 A | 8/1999 | Lerch et al. | |
| 5,994,153 A | 11/1999 | Nagel et al. | |
| 6,017,789 A | 1/2000 | Sandhu et al. | |
| 6,030,847 A | 2/2000 | Fazan et al. | |
| 6,133,159 A | 10/2000 | Vaartstra et al. | |
| 6,162,744 A | 12/2000 | Al-Shareef et al. | |
| 6,165,834 A | 12/2000 | Agarwal et al. | |
| 6,235,572 B1 * | 5/2001 | Kunitomo et al. .......... 438/240 |
| 6,265,262 B1 * | 7/2001 | Okuno et al. ............... 257/306 |
| 6,281,543 B1 * | 8/2001 | Al-Shareef et al. ......... 257/309 |

OTHER PUBLICATIONS

Tsunemine et al., A manufacturable integration technology of sputter-BST capacitor with a newly proposed thick Pt electrode, IEEE, 1998, pp. 30.3.1-30.3.4.

* cited by examiner

*Primary Examiner*—Jennifer Kennedy
(74) *Attorney, Agent, or Firm*—Dinsmore & Shohl LLP

(57) ABSTRACT

Stabilized capacitors and DRAM cells using high dielectric constant oxide dielectric materials such as $Ta_2O_5$ and $Ba_xSr_{(1-x)}TiO_3$, and methods of making such capacitors and DRAM cells are provided. A preferred method includes providing a conductive oxide electrode, depositing a first layer of a high dielectric constant oxide dielectric material on the conductive oxide electrode, oxidizing the conductive oxide electrode and the first layer of the high dielectric constant oxide dielectric material under oxidizing conditions, depositing a second layer of the high dielectric constant oxide dielectric material on the first layer of the dielectric, and depositing an upper layer electrode on the second layer of the high dielectric constant oxide dielectric material.

23 Claims, 2 Drawing Sheets

CAPACITOR WITH HIGH DIELECTRIC CONSTANT MATERIALS AND METHOD OF MAKING

BACKGROUND OF THE INVENTION

This invention relates generally to capacitors, and more particularly to capacitors made with oxide dielectrics having high dielectric constants but with reduced leakage current, and to methods of making such capacitors and their incorporation into DRAM cells.

The increase in memory cell density in DRAMs presents semiconductor chip designers and manufacturers with the challenge of maintaining sufficient storage capacity while decreasing cell area. One way of increasing cell capacitance is through cell structure techniques, including three dimensional cell capacitors. The continuing drive to decrease size has also led to consideration of materials with higher dielectric constants for use in capacitors. Dielectric constant is a value characteristic of a material and is proportional to the amount of charge that can be stored in a material when the material is interposed between two electrodes. Promising dielectric materials include $Ba_xSr_{(1-x)}TiO_3$ ("BST"), $BaTiO_3$, $SrTiO_3$, $PbTiO_3$, $Pb(Zr,Ti)O_3$ ("PZT"), $(Pb,La)(Zr,Ti)O_3$ ("PLZT"), $(Pb,La)TiO_3$ ("PLT"), $KNO_3$, $Nb_2O_5$, $Ta_2O_5$, and $LiNbO_3$, all of which have high dielectric constants making them particularly desirable for use in capacitors. However, the use of these materials has been hampered by their incompatability with current processing techniques and their leakage current characteristics.

Attempts have been made to overcome the problems associated with the use of $Ta_2O_5$. For example, U.S. Pat. No. 5,768,248 to Schuegraf involves the deposition of a dielectric nitride layer after the removal of an oxide layer on the capacitor plate. A $Ta_2O_5$ dielectric layer is then deposited, followed by a second nitride layer. The nitride layer restricts oxidation of the inner capacitor plate during the annealing of the $Ta_2O_5$ layer. In U.S. Pat. No. 5,814,852 to Sandhu et al., a primarily amorphous diffusion barrier layer is deposited on the $Ta_2O_5$ dielectric layer.

While these techniques have been successful, there remains a need for improved processes for incorporating high dielectric constant oxide dielectrics in capacitor constructions and for capacitors containing these materials.

SUMMARY OF THE INVENTION

The present invention meets these needs by providing a stabilized capacitor having improved leakage current characteristics using high dielectric constant oxide dielectric materials, and methods of making such capacitors. By "high dielectric constant oxide dielectric" materials we mean oxides of barium, titanium, strontium, lead, zirconium, lanthanum, and niobium, including, but not limited to $Ba_xSr_{(1-x)}TiO_3$ ("BST"), $BaTiO_3$, $SrTiO_3$, $Ta_2O_5$, $Nb_2O_5$, $PbTiO_3$, $Pb(Zr,Ti)O_3$ ("PZT"), $(Pb,La)(Zr,Ti)O_3$ ("PLZT"), $(Pb,La)TiO_3$ ("PLT"), $KNO_3$, and $LiNbO_3$ and having a dielectric constant of at least about 20.

In accordance with one aspect of the present invention, the method includes providing a conductive oxide electrode, depositing a first layer of a high dielectric constant oxide dielectric material onto the conductive oxide electrode, oxidizing the conductive oxide electrode and the first layer of the high dielectric constant oxide dielectric material, depositing a second layer of the high dielectric constant oxide dielectric material onto the first layer of the conductive oxide electrode, and depositing an upper layer electrode onto the second layer of the high dielectric constant oxide dielectric material. Preferably, the upper layer electrode comprises a conductive oxide.

The high dielectric constant oxide dielectric material is selected from the group consisting of $Ba_xSr_{(1-x)}TiO3$, $BaTiO_3$, $SrTiO_3$, $Ta_2O_5$, $Nb_2O_5$, $PbTiO_3$, $Pb(Zr,Ti)O_3$, $(Pb,La)(Zr,Ti)O_3$, $(Pb,La)TiO_3$, $KNO_3$, and $LiNbO_3$, and preferably comprises either $Ta_2O_5$ or $Ba_xSr_{(1-x)}TiO_3$. The high dielectric constant oxide dielectric material is preferably oxidized using a gas plasma treatment which is performed using an oxidizing gas such as, for example, $O_2$ and $O_3$, at a temperature in the range of from about 250° to about 500° C.

The upper layer electrode may be oxidized, preferably also using a plasma treatment in an oxidizing environment at a temperature in the range of from about 250° to about 500° C. Alternatively, a gas permeable electrode may be deposited on the upper layer electrode. In this case, the upper layer electrode is preferably oxidized by annealing under oxidizing conditions at a temperature in the range of from about 350° to about 500° C., and more preferably from about 400° to about 475° C. The gas permeable electrode preferably comprises platinum.

When the high dielectric constant dielectric material is $Ta_2O_5$, the second layer of $Ta_2O_5$ in the capacitor structure is preferably oxidized during fabrication. A number of oxidation methods can be used, including, but not limited to, treatment in an oxidizing gas selected from the group consisting of $O_2$ and $O_3$ at a temperature in the range of from about 300° to about 500° C., furnace oxidation at a temperature less than about 700° C. in an atmosphere containing a gas selected from the group consisting of $O_2$ and $N_2O$, and rapid thermal oxidation at a temperature of less than about 700° C. in an atmosphere containing an oxidizing gas selected from the group consisting of $O_2$ and $N_2O$.

If the use of crystalline $Ta_2O_5$ is desired, the second layer of the $Ta_2O_5$ dielectric can be crystallized before depositing the upper electrode. The $Ta_2O_5$ dielectric can be crystallized by heating the dielectric material at a temperature greater than about 700° C. in an inert atmosphere such as nitrogen or argon. The crystallization and oxidation steps may be performed simultaneously by heating the material at a temperature greater than about 700° C. in an atmosphere containing $O_2$ and $N_2O$.

When the dielectric material is $Ba_xSr_{(1-x)}TiO_3$, where x is >0 and <1, the first layer of the $Ba_xSr_{(1-x)}TiO_3$ dielectric is preferably deposited at a temperature of less than about 650° C., and more preferably in the range of from about 400° to about 500° C. The second layer of the $Ba_xSr_{(1-x)}TiO_3$ dielectric material is preferably deposited at a temperature in the range of from about 550 to about 600° C.

The conductive oxide electrode and the upper layer electrodes preferably comprise $RuO_x$ or $IrO_x$, where x is >0 and <2. When $RuO_x$ is used as the oxide electrode, the surface of the oxide electrode may be oxidized prior to depositing the first layer of the high dielectric constant dielectric material. The oxidation may be carried out at a temperature in the range of from about 400° to about 475° C. in an atmosphere containing an oxidizing gas selected from the group consisting of $O_2$, $O_3$, and $N_2O$.

Another aspect of the present invention is a capacitor comprising an oxidized conductive oxide electrode, an oxidized first layer of a high dielectric constant oxide dielectric material adjacent the oxidized conductive oxide electrode, a second layer of the high dielectric constant oxide dielectric material adjacent the first layer of the high dielectric constant oxide dielectric material, and an upper layer electrode adjacent the second layer of the high dielectric constant oxide dielectric material. The oxidized conductive oxide electrode and the oxidized first layer of the high dielectric constant oxide dielectric material are oxidized prior to the deposition of the second layer of the high dielectric constant oxide material.

The first layer of the high dielectric constant oxide dielectric material preferably has a thickness of between about 20 and about 50 Å. The high dielectric constant oxide dielectric material is preferably selected from $Ta_2O_5$ and $Ba_xSr_{(1-x)}TiO_3$. The oxidized conductive oxide electrode and the upper layer electrode are preferably comprised of $RuO_x$ and $IrO_x$. The capacitor can include a gas permeable electrode, preferably comprising platinum, adjacent to the top electrode.

Another aspect of the present invention is a DRAM cell and method of making it. In a preferred form, the method comprises providing a conductive oxide electrode, depositing a first layer of a high dielectric constant oxide dielectric material on said conductive oxide electrode, oxidizing said conductive oxide electrode and said first layer of said high dielectric constant oxide dielectric material under oxidizing conditions, depositing a second layer of said high dielectric constant oxide dielectric material on said first layer of said high dielectric constant oxide dielectric material, depositing an upper layer electrode on said second layer of said high dielectric constant oxide dielectric material, providing a field effect transistor having a pair of source/drain regions, electrically connecting one of said source/drain regions with said conductive oxide electrode and electrically connecting the other of said source/drain regions with a bit line.

Accordingly, it is a feature of the present invention to provide a stabilized capacitor having improved leakage current characteristics using high dielectric constant oxide dielectric materials, their incorporation into DRAM cells, and methods of making such capacitors. These, and other features and advantages of the present invention, will become apparent from the following detailed description, the accompanying drawings, and the appended claims.

DETAILED DESCRIPTION OF THE PREFERRED EMBODIMENTS

Figure 1:
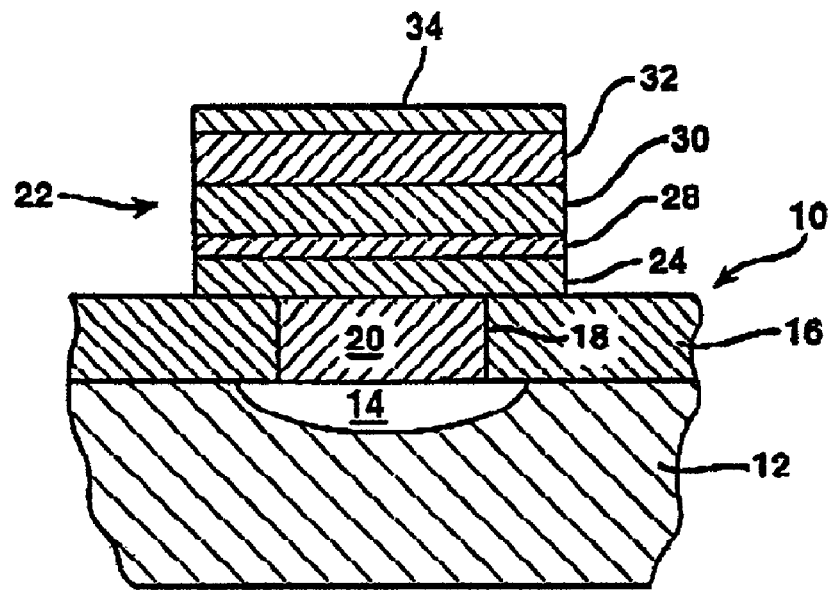
FIG. 1 is a diagrammatic fragmentary sectional view of a semiconductor substrate fragment made according to one embodiment of the present invention.

As shown in FIG. 1, a fragmentary view of a semiconductor substrate is indicated generally by reference number 10. As used herein, the term "semiconductor substrate" refers to silicon structures including silicon wafers, silicon structures in the process of fabrication, a semiconductor layer, including a semiconductor layer in the process of fabrication, and the like. The semiconductor substrate 10 includes a bulk silicon substrate 12 with a conductive diffusion area 14 formed therein. An insulating layer 16, typically a borophososilicate glass (BPSG), is provided over substrate 12. There is a contact opening 18 formed in the insulating layer 16 to diffusion area 14. A conductive material 20 fills contact opening 18 forming an electrically conductive plug, with conductive material 20 and oxide layer 16 having been planarized using conventional techniques. Conductive material 20 can be any suitable material, such as, for example, tungsten or conductively doped polysilicon. A barrier layer (not shown) of a material such as TiAlN may be present at the top of the plug.

The plug of conductive material 20 can be produced by initially forming conductively doped polysilicon to completely fill opening 18. The polysilicon layer can then be etched back using wet or dry etch processes, or by chemical-mechanical polishing (CMP) such that all conductive material has been removed from the upper surface of insulating layer 16. Preferably, the removal technique causes a slight recess of conductive material 20 within opening 18.

A capacitor 22 is provided on insulating layer 16 and plug 20, with conductive plug 20 constituting a node to which an electrical connection to capacitor 22 is made. Capacitor 22 comprises an oxide electrode 24 which is electrically conductive and has been provided and patterned over plug 20. Examples of preferred materials for electrode 24 include, but are not limited to, $RuO_x$ and $IrO_x$. Oxide electrodes, either as deposited or after crystallization by annealing in a nitrogen atmosphere, are mostly oxygen-deficient.

One example of a process for depositing oxide electrode 24 is to deposit $RuO_x$ using chemical vapor deposition (CVD) of a metalorganic precursor containing ruthenium. Typically, this process would be carried out in a reaction chamber at a pressure of about 1 Torr and a temperature of from about 150° to about 200° C. using appropriate gas flow rates for the metalorganic precursor.

A thin layer of a high dielectric constant oxide dielectric material 28 is on oxide electrode 24. The high dielectric constant oxide dielectric material is preferably either $Ta_2O_5$ or $Ba_xSr_{(1-x)}TiO_3$. Layer 28 is preferably between about 20 and about 50 Å thick. When $Ta_2O_5$ is the dielectric material, layer 28 is preferably between about 20 and about 30 Å thick. When $Ba_xSr_{(1-x)}TiO_3$ is the dielectric, layer 28 is preferably between about 40 and 50 Å thick. A second layer of high dielectric constant oxide dielectric material 30 is on first layer 28 at the desired thickness.

One example of a process for depositing a high dielectric constant oxide dielectric material such as $Ba_xSr_{(1-x)}TiO_3$ includes using CVD techniques and metalorganic precursors. Typically, such metalorganic precursors would be flowed into a reactor at an appropriate rate under reduced pressure and elevated temperatures to form the dielectric layers 28 and 30. One advantage of the present invention is that the second layer 30 is deposited at a lower temperature, as explained in greater detail below, which improves step coverage for three dimensional capacitor structures.

The capacitor structure also includes top layer electrode 32 on second layer 30 of the oxide dielectric material. Top electrode layer 32 is preferably $RuO_x$ or $IrO_x$. Top layer electrode 32 is preferably oxidized, such as by a plasma treatment at low temperatures in oxidizing conditions. Alternatively, the capacitor structure may include a gas permeable electrode 34, comprised of, for example, platinum, on the top layer electrode 32. Electrode 34 is permeable to oxygen which permits oxidation of underlying layer 32 when the capacitor is treated under annealing conditions.

Capacitor 22 is formed by depositing oxide electrode 24 onto insulating layer 16 and plug 20. Then, a thin layer of high dielectric constant oxide dielectric material 28 is deposited onto oxide electrode 24. The stack, including the thin layer of oxide dielectric 28 and the oxide electrode 24, is then oxidized. The oxidation is preferably a gas plasma treatment under oxidizing conditions and is preferably carried out at a temperature of about 400° C. using a gas containing either $O_2$ or $O_3$. For example, gas plasma may be formed using microwave power on oxygen or ozone gas sufficient to dissociate the oxygen molecules into individual activated atoms. With this step, the thin layer of oxide dielectric 28 and the oxide electrode 24 are oxidized. This provides at least the surface, and preferably an upper portion of the oxide electrode, with enough oxygen so that electrode 24 will be stable with the oxide dielectric layer 28.

When $Ba_xSr_{(1-x)}TiO_3$ is used as the oxide dielectric for layer 28, the thin layer can be deposited at a temperature in the range of from about 400 to about 500° C., which is much less than typical deposition temperatures of about 650° C. used in the prior art. The low temperature deposition of the $Ba_xSr_{(1-x)}TiO_3$ layer improves step coverage on three dimensional capacitor structures.

After oxidation of the partially fabricated capacitor stack, a second layer of high dielectric constant oxide dielectric material 30 is deposited on first layer 28 to a desired thickness. This second layer 30 of oxide dielectric is then treated as appropriate for the dielectric material permitting optimization of the dielectric properties of the layer and addressing specific integration issues, such as step coverage issues for $Ba_xSr_{(1-x)}TiO_3$, for the capacitor structure.

When $Ta_2O_5$ is used as the high dielectric constant oxide dielectric material, the second $Ta_2O_5$ layer is preferably oxidized. The oxidation procedure can be performed using known methods, including, but not limited to, plasma treatment, furnace oxidation, and rapid thermal oxidation(RTO). The plasma oxidation is preferably carried out at about 400° C. in an atmosphere containing $O_2$ or $O_3$. Either the furnace oxidation or the RTO can be performed at a temperature of less than 700° C. in an atmosphere containing $O_2$ or $N_2O$. These oxidation steps require less time and/or can be performed at lower temperatures as compared to typical single step deposition processes without plasma treatment, because no oxygen will be lost through diffusion to the bottom oxide electrode during these treatments. Despite the low-temperature, short time re-oxidation conditions, the dielectric properties of the dielectric material will still be acceptably high. For example, amorphous $Ta_2O_5$ has a permittivity of about 25, and there is less leakage current. Crystalline $Ta_2O_5$ has a permittivity of about 40 to 50. These process conditions allow the capacitor to be integrated with the wafer substrate at lower temperatures and under less oxidizing conditions than heretofore possible using prior art techniques.

If crystalline $Ta_2O_5$ is used as the dielectric material, it should be crystallized before the oxidation step. The $Ta_2O_5$ can be crystallized by heating it at a temperature above about 700° C. in a nitrogen atmosphere. The crystalline material can then be oxidized using the plasma treatment, furnace oxidation, or RTO techniques, as discussed above. Alternatively, the oxidation and crystallization steps can be performed simultaneously by heating the $Ta_2O_5$ dielectric at a temperature above 700° C. in an atmosphere of oxygen or $N_2O$. Following the crystallization/oxidation step, the dielectric material can be further oxidized using the above described techniques if needed. This additional oxidation step can be performed at lower temperatures and/or shorter times if the oxidation step followed a separate crystallization step.

When $Ba_xSr_{(1-x)}TiO_3$ is used as the high dielectric constant oxide dielectric material, the deposition temperature for applying second layer 30 of dielectric material is between about 550 and about 600° C. Again, this is less than the typical deposition temperatures used to deposit $Ba_xSr_{(1-x)}TiO_3$ in the prior art (about 650° C.). The ability to use a lower deposition temperature is believed to be the result of the first $Ba_xSr_{(1-x)}TiO_3$ layer 28 improving nucleation and growth of second layer 30. This prevents oxidation of the barrier layer/poly plug 20 (e.g., TiAlN/poly plug). The stress of the second $Ba_xSr_{(1-x)}TiO_3$ layer which is deposited is also believed to be less using a thin first layer 28. This results in improvements in the dielectric properties (e.g., less thickness dependent permittivity and less dielectric loss) of the dielectric layer. Another advantage of utilizing first layer 28 is the prevention of haze formation in the $Ba_xSr_{(1-x)}TiO_3$.

The top layer electrode 32 is then deposited on the second layer of the oxide dielectric 30. The top electrode layer 32 is preferably $RuO_x$ or $IrO_x$ which can be deposited using CVD techniques as described above. Top layer electrode 32 is then oxidized, such as by a gas plasma treatment at low temperatures in oxidizing conditions. Alternatively, a permeable electrode 34 is deposited on top layer electrode 32, which is then annealed in oxidizing conditions. The permeable electrode 34 is preferable platinum. Because oxygen can easily diffuse through platinum, it will oxidize the top layer electrode 32. In this way oxygen loss from second layer 30 of the dielectric material to top layer electrode 32 in subsequent high temperature processes is prevented.

Figure 2:
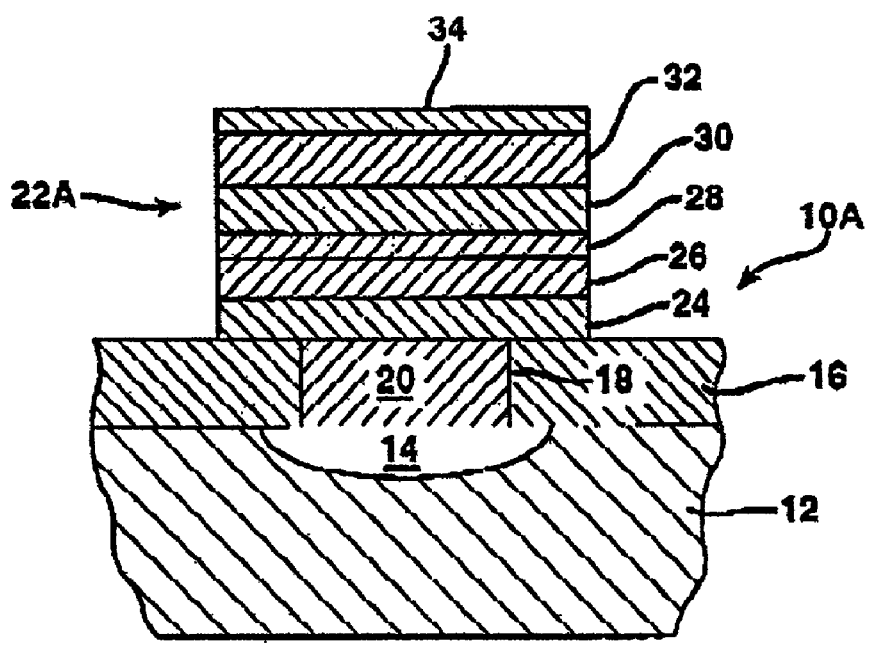
FIG. 2 is a diagrammatic fragmentary sectional view of an alternative embodiment of a semiconductor substrate fragment made according to the present invention.

FIG. 2 illustrates an alternative embodiment of the capacitor construction and method in accordance with the present invention. Like numbers from FIG. 1 have been used where appropriate, with differences indicated by the use of different reference numerals or the use of like numbers with the suffix "A." Substrate 10A includes a capacitor 22A which differs from the previously described embodiment. When $RuO_x$ is used as oxide electrode 24, the upper surface 26 of electrode 24 may be oxidized if desired. As deposited, $RuO_x$ films include both RuO and Ru metal phases. The presence of the Ru metal phase causes unstable reactions, e.g., the oxidation of Ru metal to $RuO_2$ in $Ta_2O_5$ metal-insulator-metal (MIM) processing. This condition is undesirable because it deteriorates the oxidation kinetics of $Ta_2O_5$ and also causes formation of interface defects between $RuO_x$ and $Ta_2O_5$. Therefore, it is beneficial to oxidize the upper surface of $RuO_x$ layer 24 prior to $Ta_2O_5$ deposition. This provides a stable $RuO_x/Ta_2O_5$ interface.

The overall thickness of the $RuO_x$ layer should preferably be in the range of between about 50 to about 1000 Å, and more preferably between about 100 and about 200 Å. The oxidation should be limited to the upper surface of the $RuO_x$ layer, generally between about the first 10 to about 50 Å of thickness. If the oxidation is carried out in the entire layer, rather than just the surface, the layer has a tendency to become very rough and disturbed. The oxidation procedure may be a low-temperature annealing for a short time. The oxidation is preferably performed at a temperature in the range of between about 400 to about 475° C. in an atmosphere of $O_2$, $O_3$, or $N_2O$.

The oxidation is done at a relatively low temperature because $RuO_4$, which is a vapor, forms at higher temperatures, leading to the loss of material from the surface of the layer. The oxidation can be done either before or after crystallization of the $RuO_x$. Alternatively, rather than depositing a layer of $RuO_x$, a layer of Ru metal may be deposited, and then the surface layer oxidized to form a layer of $RuO_2$.

Figure 3:
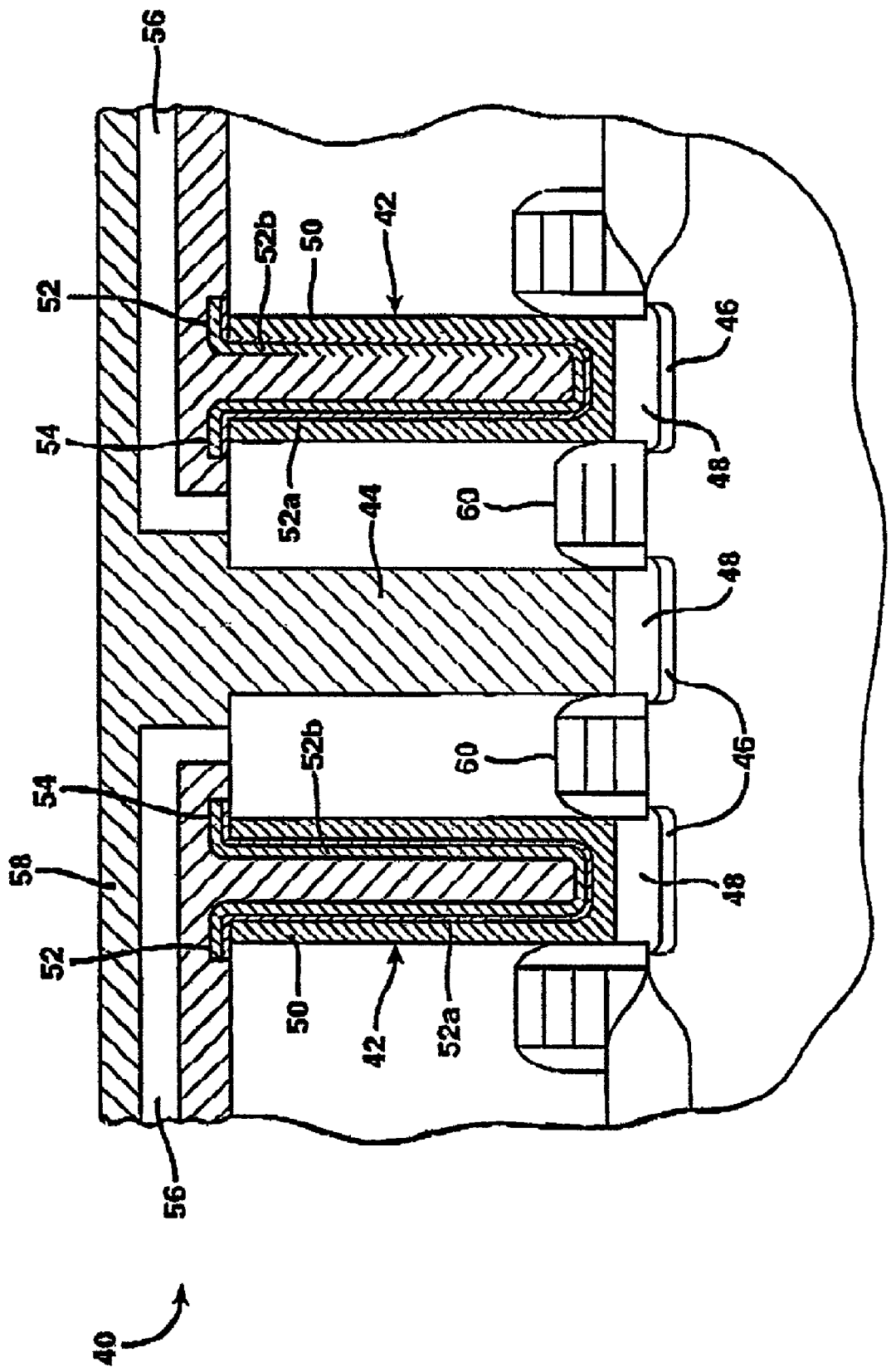
FIG. 3 is a diagrammatic fragmentary sectional view of another embodiment of the present invention.

FIG. 3 depicts another embodiment of the invention in the fabrication of DRAM circuitry. A semiconductor substrate 40 comprises two memory cells, each memory cell including a capacitor 42 and a shared bit contact 44. Capacitors 42 electrically connect with substrate diffusion regions 46 (source/drain regions) through silicide regions 48. For simplicity, capacitors 42 are shown as comprising a first capacitor electrode 50, a capacitor dielectric 52 comprising a first thin layer of a high dielectric constant oxide dielectric 52a and a second layer of a high dielectric constant oxide dielectric material 52b, and a second capacitor electrode/cell plate 54. These layers are fabricated of the materials described above, including conductive oxide electrode materials and the high dielectric constant oxide dielectric materials. These layers are processed as described above to provide the capacitor structure of the present invention. A dielectric layer 56 is formed over second capacitor plate 54. A bit line 58 is fabricated in electrical connection with bit contact 44. Word lines 60 are fabricated to enable selective gating of the capacitors relative to bit contact 44.

While certain representative embodiments and details have been shown for the purpose of illustrating the invention, it will be apparent to those skilled in the art that various changes in the methods and apparatus disclosed herein may be made without departing from the scope of the invention, which is defined in the appended claims.

What is claimed is:

1. A method of forming a capacitor comprising providing a conductive oxide electrode, depositing a first layer of a high dielectric constant oxide dielectric material on said conductive oxide electrode, oxidizing said conductive oxide electrode and said first layer of said high dielectric constant oxide dielectric material under oxidizing conditions, depositing a second layer of said high dielectric constant oxide dielectric material on said first layer of said high dielectric constant oxide dielectric material, depositing an upper layer electrode on said second layer of said high dielectric constant oxide dielectric material, and oxidizing said upper layer electrode under oxidizing conditions.

2. A method as claimed in claim 1 wherein said upper layer electrode is oxidized using a gas plasma.

3. A method as claimed in claim 2 wherein said gas plasma oxidation is carried out at a temperature in the range of from about 250° to about 500° C.

4. A method of forming a capacitor comprising providing a conductive oxide electrode, depositing a first layer of a high dielectric constant oxide dielectric material on said conductive oxide electrode, oxidizing said conductive oxide electrode and said first layer of said high dielectric constant oxide dielectric material under oxidizing conditions, depositing a second layer of said high dielectric constant oxide dielectric material on said first layer of said high dielectric constant oxide dielectric material, depositing an upper layer electrode on said second layer of said high dielectric constant oxide dielectric material, depositing a gas permeable electrode on said upper layer electrode, and oxidizing said upper layer electrode through said gas permeable electrode.

5. A method as claimed in claim 4 wherein said gas permeable electrode comprises platinum.

6. A method of forming a capacitor comprising providing a conductive oxide electrode selected from the group consisting of $RuO_x$ and $IrO_x$, depositing a first layer of a dielectric material selected from the group consisting of $Ta_2O_5$ and $Ba_xSr_{(1-x)}TiO_3$ on said conductive oxide electrode, oxidizing said conductive oxide electrode and said first layer of said dielectric material with a gas plasma such that at least the surface area of said conductive oxide electrode is provided with enough oxygen to provide stability with said first layer of dielectric material, depositing a second layer of said dielectric material on said first layer of said dielectric material, depositing an upper layer electrode on said second layer of said dielectric material, and oxidizing said upper layer electrode.

7. A method as claimed in claim 6 wherein said conductive oxide electrode and said first layer of said dielectric material are oxidized using a gas selected from the group consisting of $O_2$ and $O_3$.

8. A method as claimed in claim 6 wherein the oxidation is carried out at a temperature in the range of from about 250° to about 500° C.

9. A method as claimed in claim 6 wherein said upper layer electrode is oxidized using a second gas plasma in an oxidizing environment.

10. A method as claimed in claim 9 wherein the oxidation of said upper layer electrode is carried out at a temperature in the range of from about 250° to about 500° C.

11. A method as claimed in claim 6 wherein said upper layer electrode is selected from the group consisting of $RuO_x$ and $IrO_x$.

12. A method as claimed in claim 6 wherein said conductive oxide electrode comprises $RuO_x$ and said first layer of said dielectric material comprises $Ta_2O_5$.

13. A method as claimed in claim 12 further comprising oxidizing the surface of said conductive oxide electrode prior to depositing said first layer of said dielectric material.

14. A method as claimed in claim 13 wherein the surface of said conductive oxide electrode is oxidized at a temperature in the range of from about 400° to about 475° C.

15. A method as claimed in claim 13 wherein the surface of said conductive oxide electrode is oxidized in an atmosphere containing a gas selected from the group consisting of $O_2$, $O_3$, and $N_2O$.

16. A method of forming a capacitor comprising providing a conductive oxide electrode selected from the group consisting of $RuO_x$ and $IrO_x$, depositing a first layer of a dielectric material selected from the group consisting of $Ta_2O_5$ and $Ba_xSr_{(1-x)}TiO_3$ on said conductive oxide electrode, oxidizing said conductive oxide electrode and said first layer of said dielectric material using a gas plasma under oxidizing conditions, depositing a second layer of said dielectric material on said first layer of said dielectric material, oxidizing said second layer of said dielectric material, depositing an upper layer electrode on said second layer of said dielectric material, and oxidizing said upper layer electrode.

17. A method as claimed in claim 16 wherein said second layer of said dielectric material is oxidized by rapid thermal oxidation.

18. A method as claimed in claim 17 wherein the oxidation is carried out at a temperature less than about 700° C.

19. A method as claimed in claim 17 wherein the oxidation is carried out in an atmosphere containing a gas selected from the group consisting of $O_2$ and $N_2O$.

20. A method as claimed in claim 16 wherein said upper layer electrode is oxidized using a gas plasma under oxidizing conditions.

21. A method as claimed in claim 20 wherein the oxidation is carried out at a temperature in the range of from about 250° to about 500° C.

22. A method as claimed in claim 16 further comprising depositing a gas permeable electrode on said upper layer electrode prior to oxidizing said upper layer electrode.

23. A method as claimed in claim 22 wherein said gas permeable electrode comprises platinum.

* * * * *